US010943989B2

United States Patent
Wu et al.

(10) Patent No.: US 10,943,989 B2
(45) Date of Patent: Mar. 9, 2021

(54) GATE TO SOURCE/DRAIN LEAKAGE REDUCTION IN NANOSHEET TRANSISTORS VIA INNER SPACER OPTIMIZATION

(71) Applicant: INTERNATIONAL BUSINESS MACHINES CORPORATION, Armonk, NY (US)

(72) Inventors: Heng Wu, Guilderland, NY (US); Ruqiang Bao, Niskayuna, NY (US); Junli Wang, Slingerlands, NY (US); Lan Yu, Voorheesville, NY (US); Dechao Guo, Niskayuna, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/296,911

(22) Filed: Mar. 8, 2019

(65) Prior Publication Data
US 2020/0287021 A1    Sep. 10, 2020

(51) Int. Cl.
H01L 29/66 (2006.01)
H01L 29/06 (2006.01)
H01L 29/165 (2006.01)
H01L 21/02 (2006.01)
H01L 29/78 (2006.01)

(52) U.S. Cl.
CPC .... *H01L 29/66553* (2013.01); *H01L 21/0245* (2013.01); *H01L 29/0649* (2013.01); *H01L 29/0673* (2013.01); *H01L 29/165* (2013.01); *H01L 29/6656* (2013.01); *H01L 29/6681* (2013.01); *H01L 29/66545* (2013.01); *H01L 29/7851* (2013.01)

(58) Field of Classification Search
CPC .......... H01L 29/66553; H01L 29/0649; H01L 29/165; H01L 29/66545; H01L 29/0673; H01L 29/6681; H01L 29/6656
See application file for complete search history.

(56) References Cited

U.S. PATENT DOCUMENTS

| 9,905,672 | B2 | 2/2018 | Wang et al. |
| 10,014,390 | B1 | 7/2018 | Bouche et al. |
| 10,049,882 | B1 | 8/2018 | Chung et al. |
| 2018/0248021 | A1 | 8/2018 | Bi et al. |
| 2018/0294151 | A1 | 10/2018 | Doris et al. |
| 2018/0315829 | A1 | 11/2018 | Yamashita et al. |

OTHER PUBLICATIONS

Anonymous, "Dual Stage Inner Spacer Formation for Nanosheet-FET", IP.com Prior Art Database Technical Disclosure, Mar. 2018, 6 pages.
Anonymous, "Inner Spacer Formation Using a Deposition-Etch Technique for Beyond-7nm Nanosheet CPP Scaling", IP.com Prior Art Database Technical Disclosure, Apr. 2018, 8 pages.

*Primary Examiner* — Anthony Ho
(74) *Attorney, Agent, or Firm* — Tutunjian & Bitetto, P.C.; L. Jeffrey Kelly

(57) ABSTRACT

A method for fabricating a semiconductor device includes forming a first inner spacer layer along a substrate and a nanosheet stack disposed on the substrate, performing an ultraviolet (UV) condensation process to form a hardened inner spacer from the first inner spacer layer, forming a second inner spacer layer along the hardened inner spacer, and removing material to form inner spacers by performing an inner spacer etch.

20 Claims, 7 Drawing Sheets

GATE TO SOURCE/DRAIN LEAKAGE REDUCTION IN NANOSHEET TRANSISTORS VIA INNER SPACER OPTIMIZATION

BACKGROUND

The present invention generally relates to semiconductor devices, and more particularly to nanosheet transistors and methods of forming the same.

A nanosheet refers to a two-dimensional nanostructure with a thickness in a scale ranging from about 1 nm to about 100 nm. Nanosheet transistors such as, e.g., field-effect transistors (FETs), can be used to shrink sizes of transistor devices such as, e.g., complementary metal-oxide semiconductor (CMOS) devices. Nanosheet devices can include a channel region including a plurality of alternating sheets of semiconductor material.

SUMMARY

In accordance with an embodiment of the present invention, a method for fabricating a semiconductor device is provided. The method includes forming a first inner spacer layer along a substrate and a nanosheet stack disposed on the substrate. The nanosheet stack has alternating first and second layers including first and second semiconductor material, respectively. The method further includes performing an ultraviolet (UV) condensation process to form a hardened inner spacer from the first inner spacer layer, forming a second inner spacer layer along the hardened inner spacer, and removing material to form inner spacers by performing an inner spacer etch.

In accordance with another embodiment of the present invention, a method for fabricating a semiconductor device is provided. The method includes forming a nanosheet stack on a silicon (Si) substrate. The nanosheet stack has alternating first and second layers including first and second semiconductor material, respectively. The method further includes forming a sacrificial dummy gate structure on the nanosheet stack, forming a spacer along the sacrificial gate structure and the nanosheet stack, forming indentations within the nanosheet stack, forming a first inner spacer layer along the substrate and the nanosheet stack, performing an ultraviolet (UV) condensation process to form a hardened inner spacer from the first inner spacer layer, forming a second inner spacer layer along the hardened inner spacer, and removing material to form inner spacers by performing an inner spacer etch.

In accordance with yet another embodiment of the present invention, a semiconductor device is provided. The device includes a substrate and a nanosheet stack having a plurality of nanosheet layers separated by inner spacers disposed on the substrate. The inner spacers include at least one inner spacer layer hardened by ultraviolet (UV) condensation. The device further includes source/drain regions disposed on the substrate adjacent to the nanosheet stack, dielectric layers disposed on the source/drain regions, and a spacer disposed on the nanosheet stack and sidewalls of the source/drain regions and sidewalls of the dielectric layers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 2:
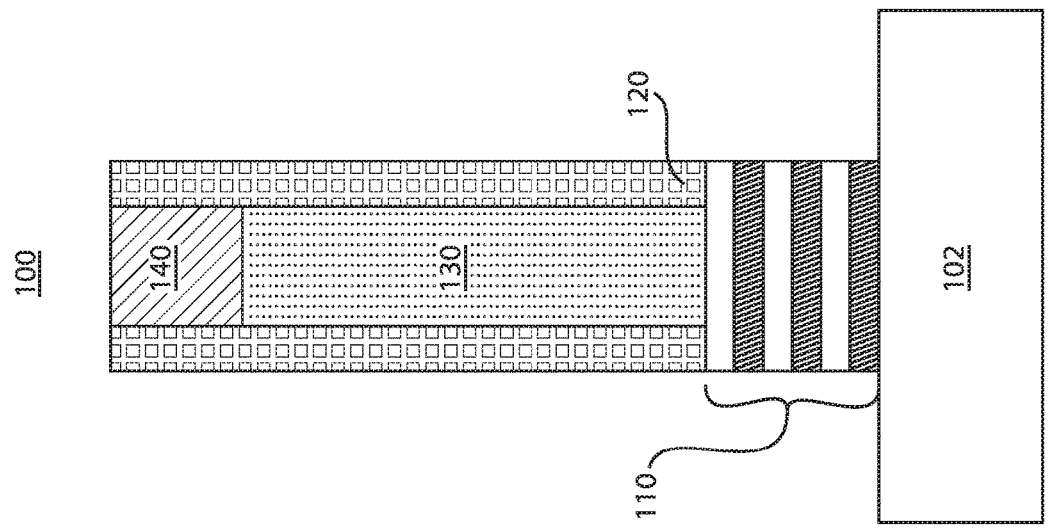
FIG. 2 is a cross-sectional view of a fin channel etch performed during the fabrication of the semiconductor device, in accordance with an embodiment of the present invention.

The embodiments described herein can optimize inner spacers that separate the gate of a transistor from the source/drain region of a transistor. For example, during channel release, acid flow (e.g., hydrochloric acid (HCL) flow) can sneak through pin holes on inner spacers, thus etching out of the source/drain epitaxial material. The embodiments describe herein can apply an ultraviolet (UV) radiation process (e.g., double UV radiation) to create a double layered inner spacer. The UV radiation process can harden the inner spacer and ensure that the penetration depth is below deposited layer thickness, thereby improving inner spacer quality that can prevent source/drain epitaxial material etch out.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
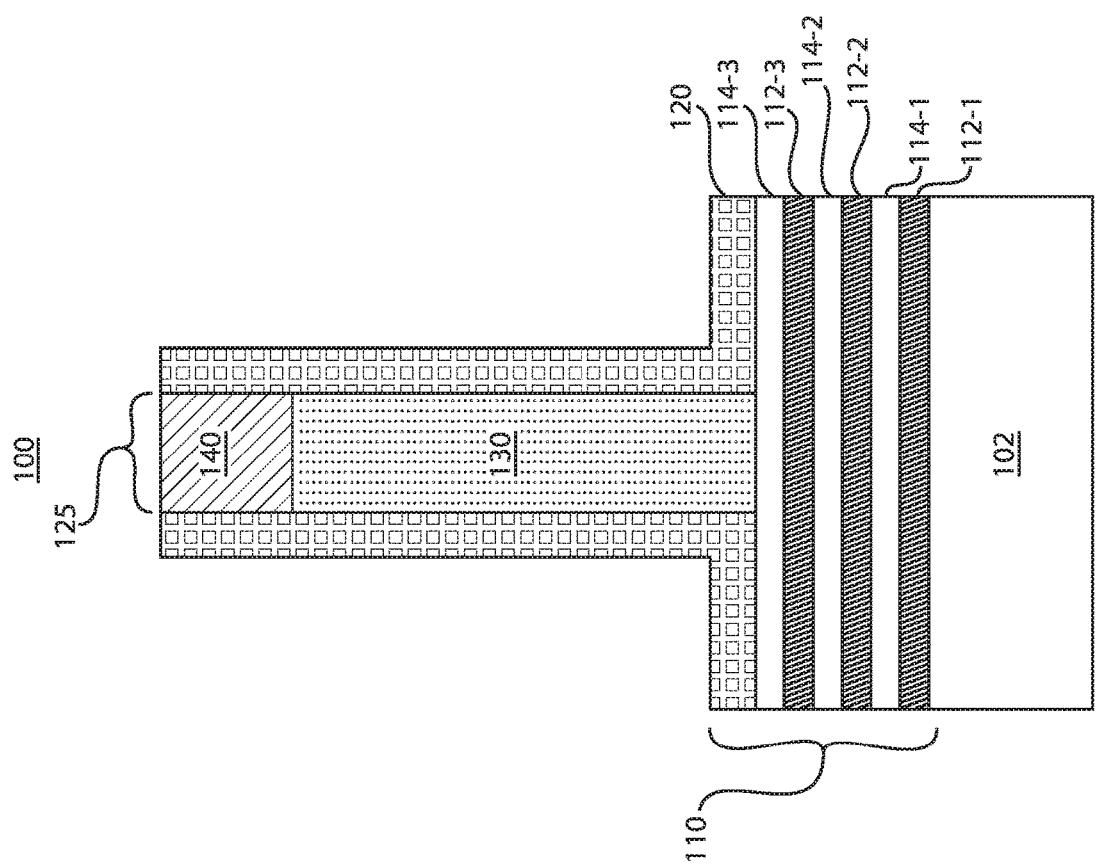
FIG. 1 is a cross-sectional view of the formation of a nanosheet stack, sacrificial gate structure and spacer during the fabrication of a semiconductor device, in accordance with an embodiment of the present invention.

Referring now to the drawings in which like numerals represent the same or similar elements and initially to FIG. 1, a cross-sectional view of a semiconductor device 100 is provided.

As shown, the device 100 includes a substrate 102 having multiple layers formed thereon. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown, a nanosheet stack ("stack") 110 can be formed on the substrate 102. The stack 110 can include alternating semiconductor material layers 112-1, 114-1, 112-2, 114-2, 112-3 and 114-3 that correspond to a channel region. Although six layers are shown included in the stack 110 in this illustrative embodiment, the stack 110 can include any suitable number of layers in accordance with the embodiments described herein. In one embodiment, the stack 110 can include alternating Si/SiGe nanosheet layers. For example, layers 112-1 through 112-3 can include SiGe nanosheet layers, while layers 114-1 through 114-3 can include Si layers. Accordingly, layers 114-1 through 114-3 can include the same material as the substrate 102 (e.g., Si).

The stack 110 can be formed using any suitable process in accordance with the embodiments described herein. For example, in one embodiment, the stack 110 can be formed via epitaxially growing each of the layers 112-1 through 112-3 and 114-1 through 114-3.

The terms "epitaxial growth and/or deposition" and "epitaxially formed and/or grown," mean the growth of a semiconductor material (e.g., crystalline material) on a deposition surface of another semiconductor material (e.g., crystalline material), in which the semiconductor material being grown (e.g., crystalline over layer) has substantially the same crystalline characteristics as the semiconductor material of the deposition surface (e.g., seed material). In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

As further shown, a sacrificial (e.g., dummy) gate structure 125 including sacrificial (e.g., dummy) gate material 130 and a mask 140 are formed on the stack 110. The sacrificial gate material 130 can include any suitable material in accordance with the embodiments described herein. Later in the process sequence, the sacrificial gate structure 125 will be removed, and can be replaced with a functional gate structure having a gate conductor and a gate dielectric.

The mask 140 can include soft and/or hardmask materials and can be formed using deposition, photolithography and etching. In one embodiment, the mask 140 can be a hardmask. For example, the mask 140 can include a nitride-containing material, such as, e.g., a silicon nitride material (e.g., SiN). However, the mask 140 can include any suitable dielectric material that may be deposited by, e.g., chemical vapor deposition (CVD) and related methods. Other compositions for the mask 140 include, but are not limited to, silicon oxides, silicon oxynitrides, silicon carbides, silicon carbonitrides, etc. Spin-on dielectrics that can be utilized as a material for the mask 140 can include, but are not limited to: silsequioxanes, siloxanes, and boron phosphate silicate glass (BPSG).

As further shown, a spacer 120 can be formed along the sacrificial gate structure 125 and the stack 110. The spacer 120 can be formed by depositing a conformal layer of a dielectric material. Examples of suitable dielectric materials for the spacer 120 include, but are not limited to, oxides, nitrides and/or oxynitrides.

With reference to FIG. 2, a fin channel etch can be performed to remove portions of the stack 110 and the spacer 120. Any suitable etch process can be used to perform the fin channel etch in accordance with the embodiments described herein. As will be described below, source/drain regions can be formed on the substrate 102 in the areas exposed by the fin channel etch.

Figure 3:
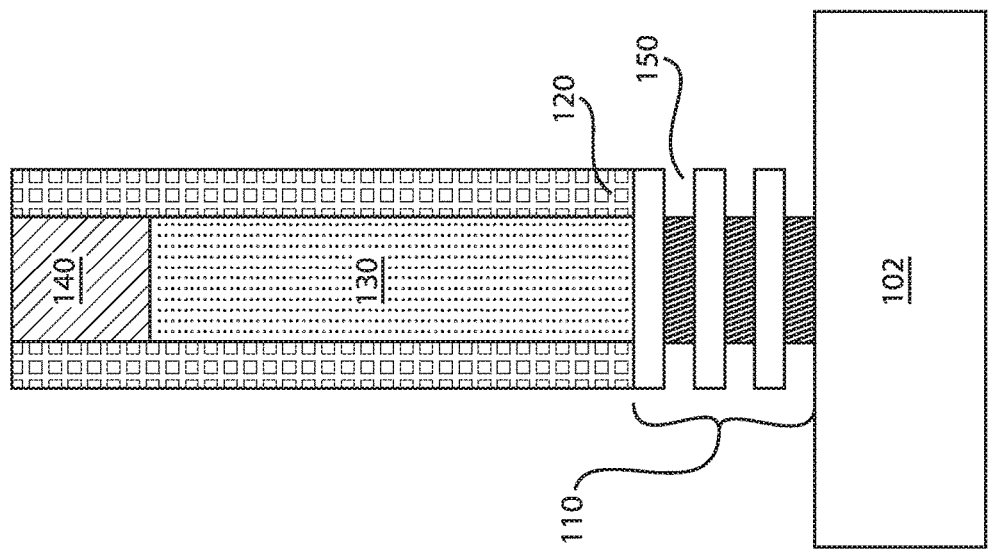
FIG. 3 is a cross-sectional view of the formation of indentations within the fin channel during the fabrication of the semiconductor device, in accordance with an embodiment of the present invention.

With reference to FIG. 3, indentations 150 can be formed within the stack 110. As shown, the indentations 150 can be formed by removing material from the layers 112-1 through 112-3. For example, a selective etch process can used to remove the material from the layers 112-1 through 112-3 in a lateral direction. The selective etch process can be dry etch based or wet chemistry based. For example, in the embodiment in which the layers 112-1 through 112-3 include SiGe and the layers 114-1 through 114-3 include Si, an $H_2O_2$ or HCl based wet chemistry based etch can selectively remove the SiGe from the Si. Precise control of the etch time can be needed to control the amount of indentation.

Figure 4:
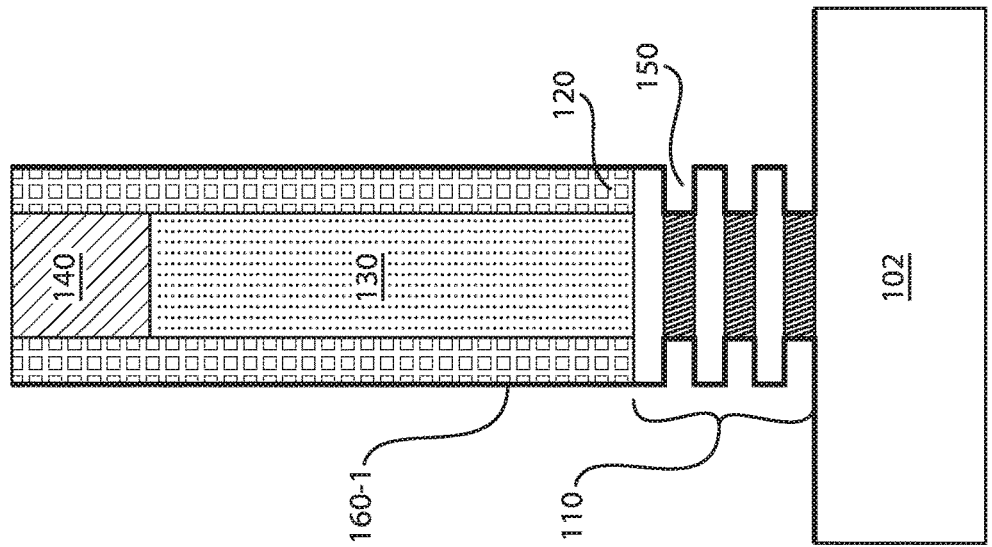
FIG. 4 is a cross-sectional view of the formation of a first inner spacer layer during the fabrication of the semiconductor device, in accordance with an embodiment of the present invention.

With reference to FIG. 4, an inner spacer layer 160-1 can be formed. As shown, the inner spacer layer 160-1 can be conformally formed along the spacer 120, the stack 110 and the substrate 102. For example, the inner spacer layer 160-1 can be deposited conformally by using ALD or CVD process. The inner spacer layer 160-1 can include any suitable dielectric material in accordance with the embodiments described herein. In one embodiment, the inner spacer layer 160-1 can include a low-k dielectric material. A low-k dielectric material is a material with a small relative dielectric constant as compared to silicon dioxide.

More specifically, the low-k dielectric material of the inner spacer layer 160-1 can have a dielectric constant that is less than about 4.0 (e.g., about 3.9). In one embodiment, the low-k dielectric material of the inner spacer layer 160-1 can have a dielectric constant ranging from, e.g., about 1.75 to about 3.5. In another embodiment, the low-k dielectric material of the inner spacer layer 160-1 have a dielectric constant ranging from, e.g., about 2.0 to about 3.2. In yet another embodiment, the low-k dielectric material of the inner spacer layer 160-1 can have a dielectric constant ranging from, e.g., about 2.25 to about 3.0. Examples of suitable low-k dielectric materials that the inner spacer layer 160-1 can be formed from include, but are not limited to, nitrides (e.g., SiN), carbonitrides (e.g., SiCN, SiBCN, and SiOCN), organosilicate glass (OSG), oxides (e.g., fluorine doped silicon dioxide, carbon doped silicon dioxide, porous silicon dioxide, and porous carbon doped silicon dioxide), spin-on materials (e.g., spin-on organic polymeric dielectrics and spin-on silicon based polymeric dielectrics (e.g., hydrogen silsesquioxane (HSQ) and methylsilsesquioxane (MSQ))), etc.

Figure 5:
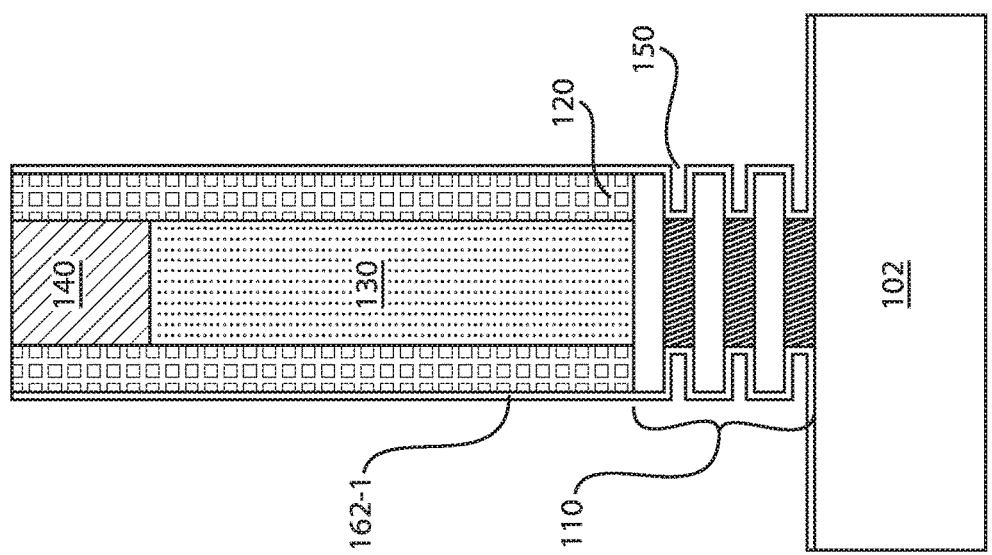
FIG. 5 is a cross-sectional view of a first ultraviolet (UV) condensation performed during the fabrication of the semiconductor device, in accordance with an embodiment of the present invention.

With reference to FIG. 5, a first ultraviolet (UV) condensation process can be performed to form hardened inner spacer 162-1 from inner spacer layer 160-1. The first UV condensation process uses UV light to harden the material of the inner spacer layer 160-1 to form the hardened inner spacer 162-1. For example, the first UV condensation process can be performed in temperature conditions of, e.g., about 200° C. to about 300° C. with an exposure time, e.g., about 1 minute to about 3 minutes. More specifically, the first UV condensation process can be performed in temperature conditions of, e.g., about 250° C. with an exposure time, e.g., about 2 minutes. The first UV condensation process can be performed to enhance inner spacer quality.

Figure 6:
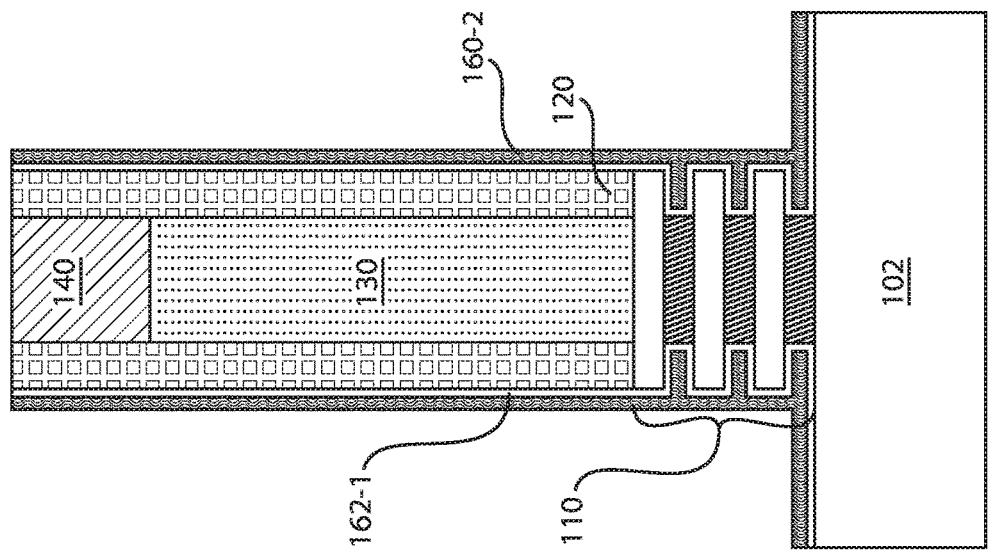
FIG. 6 is a cross-sectional view of the formation of a second inner spacer layer during the fabrication of the semiconductor device, in accordance with an embodiment of the present invention.

With reference to FIG. 6, an inner spacer layer 160-2 can be formed. As shown, the inner spacer layer 160-2 can be conformally formed along the hardened inner spacer 162-1. For example, the inner spacer layer 160-2 can be deposited conformally by using ALD or CVD process. The inner spacer layer 160-2 can include any suitable dielectric material in accordance with the embodiments described herein. For example, the inner spacer layer 160-2 can include a low-k dielectric material. In one embodiment, the inner spacer layer 160-2 can include the same material as the inner spacer layer 160-1. In another embodiment, the inner spacer layer 160-2 can include a different material than the inner spacer 160-1.

Figure 7:
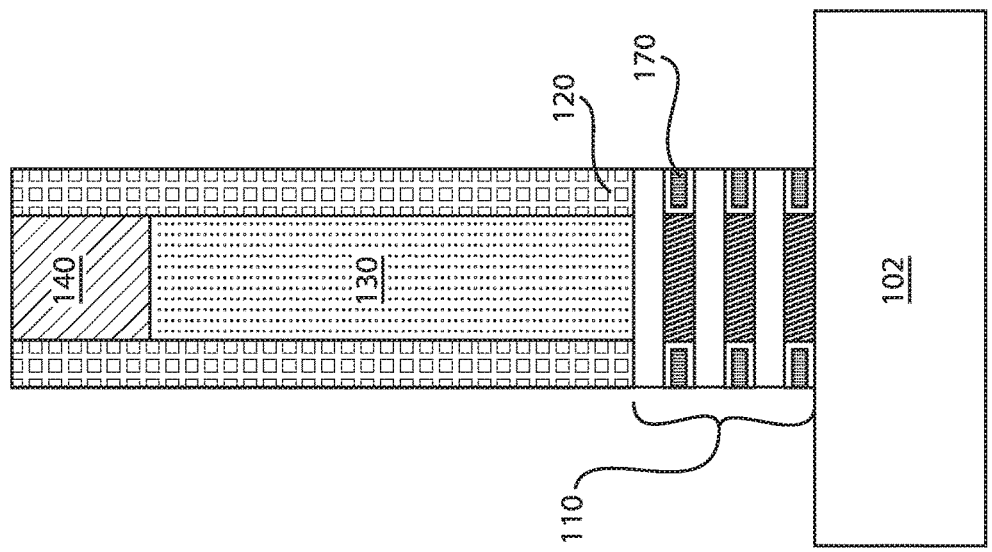
FIG. 7 is a cross-sectional view of a second UV condensation performed during the fabrication of the semiconductor device, in accordance with an embodiment of the present invention.

With reference to FIG. 7, an optional second UV condensation process can be performed to form hardened inner spacer 162-2 from inner spacer layer 160-2. Similar to the first UV condensation process, the second UV condensation process uses UV light to harden the material of the inner spacer layer 160-2 to form the hardened inner spacer 162-2. For example, the second UV condensation process can be performed in temperature conditions of, e.g., about 200° C. to about 300° C. with an exposure time, e.g., about 1 minute to about 3 minutes. More specifically, the second UV condensation process can be performed in temperature conditions of, e.g., about 250° C. with an exposure time, e.g., about 2 minutes. However, such temperature conditions and exposure times should not be considered limiting. The second UV condensation process can be performed to enhance inner spacer quality.

Figure 8:
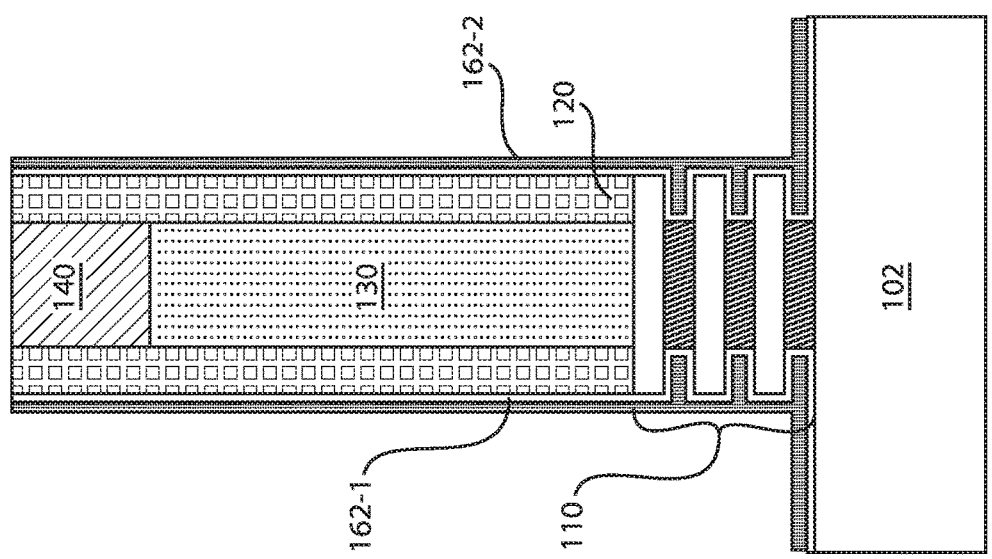
FIG. 8 is a cross-sectional view of an inner spacer etch performed during the fabrication of the semiconductor device, in accordance with an embodiment of the present invention.

With reference to FIG. 8, an inner spacer etch can be performed to remove material to form inner spacers 170. Any suitable etch process can be used to perform the inner spacer etch in accordance with the embodiments described herein. Due to the UV condensation process(es) performed on the inner spacer(s) to form the hardened inner spacers, the inner spacers 170 can prevent epitaxial etch out.

Figure 9:
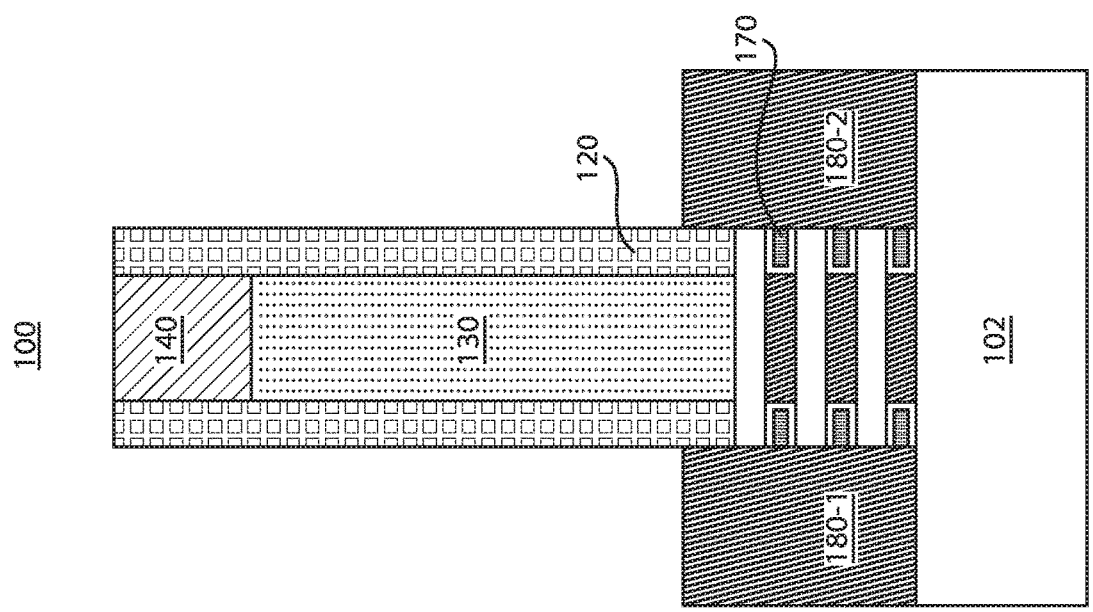
FIG. 9 is a cross-sectional view of the formation of source/drain regions during the fabrication of the semiconductor device, in accordance with an embodiment of the present invention.

With reference to FIG. 9, source/drain (S/D) regions 180-1 and 180-2 can be formed on the substrate 102. In one embodiment, the S/D regions 180-1 and 180-2 can be formed via epitaxial growth. The S/D regions 180-1 and 180-2 can be epitaxially grown using any suitable process in accordance with the embodiments described herein.

For example, S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE), vapor-phase epitaxy (VPE), liquid-phase epitaxy (LPE), or other suitable processes. Epitaxial Si, SiGe and/or carbon doped Si (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between about e.g., $2\times10^{20}$ cm$^{-3}$ to about $1\times10^{21}$ cm$^{-3}$. When Si:C is epitaxially grown, the Si:C layer can include carbon in the range of, e.g., about 0.2 to about 3.0%. When SiGe is epitaxially grown, the SiGe may can germanium content in the range of e.g., about 5% to about 80%, or preferably between, e.g., about 20% to about 60%.

Figure 10:
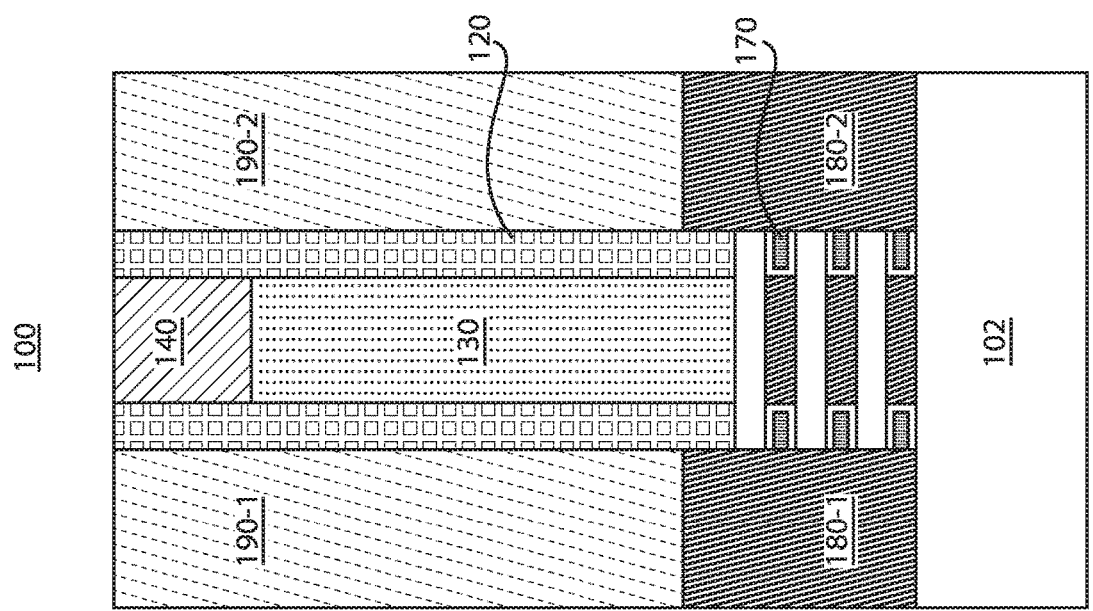
FIG. 10 is a cross-sectional view of the formation of dielectric material during the fabrication of the semiconductor device, in accordance with an embodiment of the present invention.

With reference to FIG. 10, dielectric layers 190-1 and 190-2 can be formed on the S/D regions 180-1 and 180-2, respectively. The dielectric layers 190-1 and 190-2 can include any suitable dielectric material in accordance with the embodiments described herein. For example, the dielectric layers 190-1 and 190-2 can include, e.g., silicon dioxide (SiO$_2$).

Figure 11:
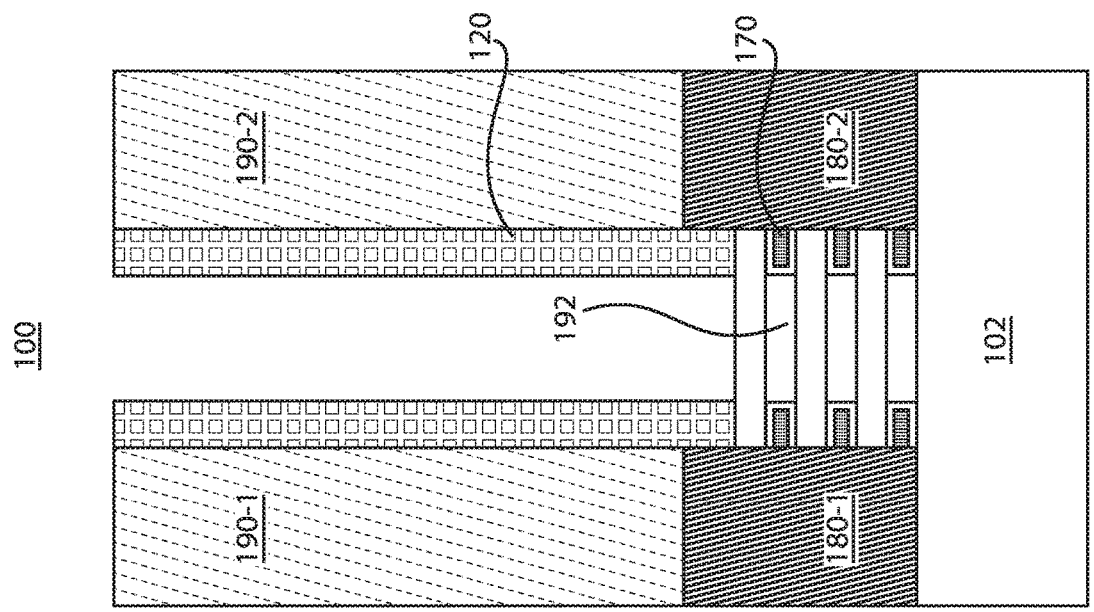
FIG. 11 is a cross-sectional view of the removal of the sacrificial gate structure during the fabrication of the semiconductor device, in accordance with an embodiment of the present invention.

With reference to FIG. 11, the sacrificial gate structure 125 can be removed. Any suitable process can be used to remove the sacrificial gate structure 125 in accordance with the embodiments described herein. For example, the sacrificial gate structure 125 can be removed using a dummy gate pull process.

Figure 12:
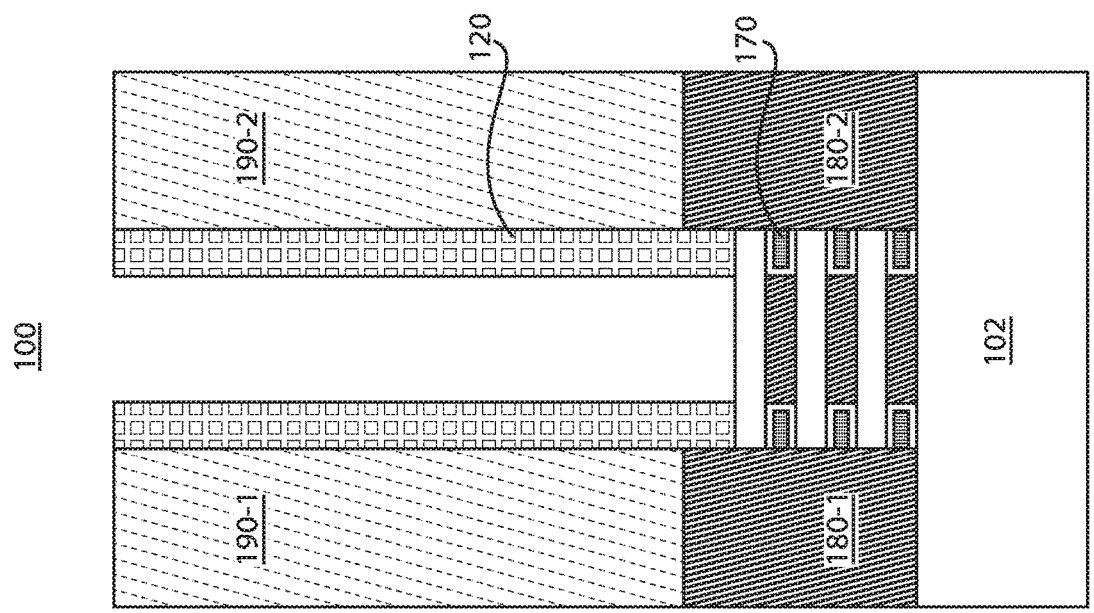
FIG. 12 is a cross-sectional view of the removal of layers from the nanosheet stack during the fabrication of the semiconductor device, in accordance with an embodiment of the present invention.

With reference to FIG. 12, the layers 112-1 through 112-3 can be removed. Any suitable process can be used to remove the layers 112-1 through 112-3 in accordance with the embodiments described herein. For example, the layers 112-1 through 112-3 can be removed using a channel release process (e.g., SiGe channel release process).

Further downstream processing (not shown) can be performed to finish the fabrication the device 100.

Figure 13:
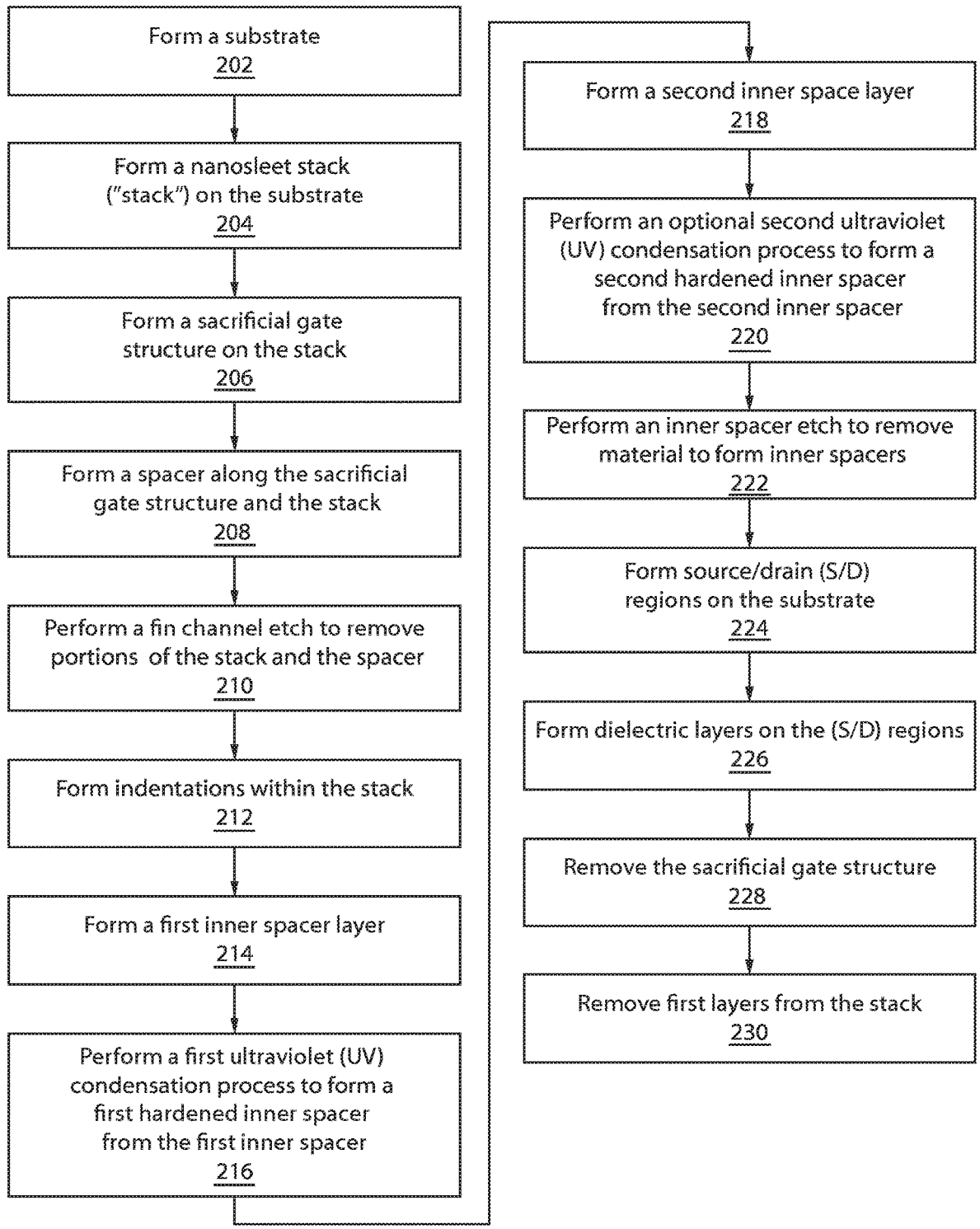
FIG. 13 is a block/flow diagram illustrating a system/method for fabricating a semiconductor device, in accordance with an embodiment of the present invention.

With reference to FIG. 13, a block/flow diagram is shown illustrating a system/method 200 for fabricating a semiconductor device.

At block 202, a substrate is formed. The substrate can include any suitable substrate structure, e.g., a bulk semiconductor, a semiconductor-on-insulator (SOI) substrate, etc. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

At block 204, a nanosheet stack ("stack") is formed on the substrate. The stack can correspond to a channel region including alternating first and second layers including first and second semiconductor material, respectively. The stack can include any suitable number of layers in accordance with the embodiments described herein. In one embodiment, the first semiconductor material can include SiGe and the second semiconductor material can include Si. Accordingly, the second layers can include the same material as the substrate (e.g., Si).

The stack can be formed using any suitable process in accordance with the embodiments described herein. For example, in one embodiment, the stack can be formed via epitaxially growing each of the layers of the stack.

At block 206, a sacrificial (e.g., dummy) gate structure is formed on the stack. The sacrificial gate structure can include a sacrificial (e.g., dummy) gate material and a mask formed on the sacrificial dummy gate material. The sacrificial gate material and the mask can include any suitable material in accordance with the embodiments described herein.

At block 208, a spacer is formed along the sacrificial gate structure and the stack. The spacer can be formed by depositing a conformal layer of a dielectric material.

Examples of suitable dielectric materials for the spacer 120 include, but are not limited to, oxides, nitrides and/or oxynitrides.

At block 210, a fin channel etch is performed to remove portions of the stack and the spacer. Any suitable etch process can be used to perform the fin channel etch in accordance with the embodiments described herein.

At block 212, indentations are formed within the stack. The indentations can be formed by removing material from the layers including the first semiconductor material.

At block 214, a first inner spacer layer is formed. The first inner spacer layer can be conformally formed along the spacer, the stack and the substrate. For example, the first inner spacer layer can be deposited conformally by using ALD or CVD process. The first inner spacer layer can include any suitable dielectric material in accordance with the embodiments described herein. In one embodiment, the first inner spacer layer can include a low-k dielectric material.

More specifically, the low-k dielectric material of the first inner spacer layer can have a dielectric constant that is less than about 4.0 (e.g., about 3.9). In one embodiment, the low-k dielectric material of the first inner spacer layer can have a dielectric constant ranging from, e.g., about 1.75 to about 3.5. In another embodiment, the low-k dielectric material of the first inner spacer layer have a dielectric constant ranging from, e.g., about 2.0 to about 3.2. In yet another embodiment, the low-k dielectric material of the first inner spacer layer can have a dielectric constant ranging from, e.g., about 2.25 to about 3.0. Examples of suitable low-k dielectric materials that the first inner spacer layer can be formed from include, but are not limited to, nitrides (e.g., SiN), carbonitrides (e.g., SiCN, SiBCN, and SiOCN), organosilicate glass (OSG), oxides (e.g., fluorine doped silicon dioxide, carbon doped silicon dioxide, porous silicon dioxide, and porous carbon doped silicon dioxide), spin-on materials (e.g., spin-on organic polymeric dielectrics and spin-on silicon based polymeric dielectrics (e.g., hydrogen silsesquioxane (HSQ) and methylsilsesquioxane (MSQ))), etc.

At block 216, a first ultraviolet (UV) condensation process is performed to form a first hardened inner spacer from the first inner spacer layer. The first UV condensation process uses UV light to harden the material of the first inner spacer layer to form the first hardened inner spacer. For example, the first UV condensation process can be performed in temperature conditions of, e.g., about 200° C. to about 300° C. with an exposure time, e.g., about 1 minute to about 3 minutes. More specifically, the first UV condensation process can be performed in temperature conditions of, e.g., about 250° C. with an exposure time, e.g., about 2 minutes. The first UV condensation process can be performed to enhance inner spacer quality.

At block 218, a second inner spacer layer is formed. The second inner spacer layer can be conformally formed along the first hardened inner spacer. For example, the second inner spacer layer can be deposited conformally by using ALD or CVD process. The second inner spacer layer can include any suitable dielectric material in accordance with the embodiments described herein. For example, the second inner spacer layer can include a low-k dielectric material. In one embodiment, the second inner spacer layer can include the same material as the first inner spacer layer. In another embodiment, the second inner spacer layer can include a different material than the first inner spacer layer.

At block 220, an optional second UV condensation process can be performed to form a second hardened inner spacer from the second inner spacer layer. Similar to the first UV condensation process, the second UV condensation process uses UV light to harden the material of the second inner spacer layer to form the second hardened inner spacer. For example, the second UV condensation process can be performed in temperature conditions of, e.g., about 200° C. to about 300° C. with an exposure time, e.g., about 1 minute to about 3 minutes. More specifically, the second UV condensation process can be performed in temperature conditions of, e.g., about 250° C. with an exposure time, e.g., about 2 minutes. The second UV condensation process can be performed to enhance inner spacer quality.

At block 222, an inner spacer etch is performed to remove material to form inner spacers. Any suitable etch process can be used to perform the inner spacer etch in accordance with the embodiments described herein. Due to the UV condensation process(es) performed on the inner spacer(s) to form the hardened inner spacers, the inner spacers can prevent epitaxial etch out.

At block 224, source/drain (S/D) regions are formed on the substrate. In one embodiment, the S/D regions can be formed via epitaxial growth. The S/D regions can be epitaxially grown using any suitable process in accordance with the embodiments described herein.

At block 226, dielectric layers are formed on the S/D regions. The dielectric layers can include any suitable dielectric material in accordance with the embodiments described herein. For example, the dielectric layers can include, e.g., silicon dioxide ($SiO_2$).

At block 228, the sacrificial gate structure is removed. Any suitable process can be used to remove the sacrificial gate structure in accordance with the embodiments described herein. For example, the sacrificial gate structure can be removed using a dummy gate pull process.

At block 230, the first layers are removed from the stack. Any suitable process can be used to remove the first layers in accordance with the embodiments described herein. For example, the first layers can be removed using a channel release process (e.g., SiGe channel release process).

Further downstream processing can be performed to finish the fabrication the device.

Further details regarding the process of FIG. 13 are described above with reference to FIGS. 1-12.

Having described preferred embodiments of a semiconductor device and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device, comprising:
    forming a first inner spacer layer along a substrate and a nanosheet stack disposed on the substrate, the nanosheet stack having alternating first and second layers including first and second semiconductor material, respectively;
    performing an ultraviolet (UV) condensation process to form a hardened inner spacer from the first inner spacer layer;

forming a second inner spacer layer along the hardened inner spacer; and forming inner spacers by performing an inner spacer etch.

2. The method of claim 1, wherein the first semiconductor material includes silicon germanium (SiGe) and the second semiconductor material including silicon (Si).

3. The method of claim 1, further comprising forming the nanosheet stack on the substrate.

4. The method of claim 3, further comprising forming a sacrificial dummy gate structure on the nanosheet stack, the sacrificial dummy gate structure including sacrificial gate material and a mask disposed on the sacrificial gate material.

5. The method of claim 4, further comprising forming a spacer along the sacrificial gate structure and the nanosheet stack.

6. The method of claim 1, further comprising forming indentations within the nanosheet stack.

7. The method of claim 6, wherein the indentations are formed within the first layers of the nanosheet stack.

8. The method of claim 1, further comprising performing a second UV condensation process to form a second hardened inner spacer from the second inner spacer.

9. The method of claim 1, further comprising:
forming source/drain regions on the substrate;
forming dielectric layers on the source/drain regions;
removing the sacrificial gate structure; and
removing the first layers from the nanosheet stack.

10. The method of claim 9, wherein removing the sacrificial gate structure includes using a dummy gate pull process.

11. The method of claim 9, wherein removing the first layers from the nanosheet stack includes using a channel release process.

12. A method for fabricating a semiconductor device, comprising:
forming a nanosheet stack on a silicon (Si) substrate, the nanosheet stack having alternating first and second layers including silicon germanium (SiGe) and Si, respectively;
forming a sacrificial dummy gate structure on the nanosheet stack;
forming a spacer along the sacrificial gate structure and the nanosheet stack;
forming indentations within the nanosheet stack;
forming a first inner spacer layer along the substrate and the nanosheet stack;
performing an ultraviolet (UV) condensation process to form a hardened inner spacer from the first inner spacer layer;
forming a second inner spacer layer along the hardened inner spacer; and
forming inner spacers by performing an inner spacer etch.

13. The method of claim 12, wherein the indentations are formed within the first layers of the nanosheet stack.

14. The method of claim 12, further comprising performing a second UV condensation process to form a second hardened inner spacer from the second inner spacer.

15. The method of claim 12, further comprising:
forming source/drain regions on the substrate;
forming dielectric layers on the source/drain regions;
removing the sacrificial gate structure; and
removing the first layers from the nanosheet stack.

16. The method of claim 15, wherein removing the sacrificial gate structure includes using a dummy gate pull process.

17. The method of claim 15, wherein removing the first layers from the nanosheet stack includes using a channel release process.

18. A method for fabricating a semiconductor device, comprising:
performing an ultraviolet (UV) condensation process to form a hardened inner spacer from a first inner spacer layer, the first inner spacer layer being formed at least on a nanosheet stack disposed on a substrate;
forming a second inner spacer layer along the hardened inner spacer; and
forming inner spacers by performing an inner spacer etch.

19. The method of claim 18, further comprising:
forming indentations within the nanosheet stack; and
after forming the indentations, forming the first inner spacer layer along the substrate and the nanosheet stack.

20. The method of claim 18, further comprising performing a second UV condensation process to form a second hardened inner spacer from the second inner spacer.

* * * * *